United States Patent [19]

Charlot et al.

[11] Patent Number: 5,537,621
[45] Date of Patent: Jul. 16, 1996

[54] INTEGRATED MEMORY, METHOD FOR MANAGING IT, AND RESULTANT INFORMATION PROCESSING SYSTEM

[75] Inventors: Didier Charlot, Grenoble; Josiane Keryvel, Versailles; Christian Bernard, Les Clayes sous Bois, all of France

[73] Assignee: Bull, S.A., Paris, France

[21] Appl. No.: 84,197

[22] PCT Filed: Nov. 16, 1992

[86] PCT No.: PCT/FR92/01062

§ 371 Date: Jul. 2, 1993

§ 102(e) Date: Jul. 2, 1993

[87] PCT Pub. No.: WO93/10497

PCT Pub. Date: May 27, 1993

[30] Foreign Application Priority Data

Nov. 18, 1991 [FR] France ................................ 91 14182

[51] Int. Cl.⁶ ............................................. G06F 11/34
[52] U.S. Cl. ....................................... 395/182.06; 395/405
[58] Field of Search ...................................... 395/575, 405, 395/401, 180, 181, 182.06, 183.18; 371/10.1; 364/245.3, 246.8, 970, 970.1, 971; 365/200, 201

[56] References Cited

U.S. PATENT DOCUMENTS

| | | |
|---|---|---|
| 3,958,228 | 5/1976 | Coombes et al. |
| 4,168,541 | 9/1979 | DeKarske ................... 364/200 |
| 4,234,935 | 11/1980 | Schreiner. |
| 4,562,536 | 12/1985 | Keeley et al. |
| 4,706,136 | 11/1987 | Wentzel et al. |
| 4,744,049 | 5/1988 | Kuban et al. |
| 4,809,276 | 2/1989 | Lemay et al. |
| 5,031,054 | 7/1991 | Lewis. |
| 5,070,502 | 12/1991 | Supnik .......................... 371/11.1 |
| 5,075,804 | 12/1991 | Beyring. |
| 5,200,959 | 4/1993 | Gross et al. ................... 371/21.6 |
| 5,216,655 | 6/1993 | Hearn et al. ................... 369/58 |
| 5,299,160 | 3/1994 | Mori ............................. 365/200 |
| 5,299,318 | 3/1994 | Bernard et al. ................. 395/375 |

FOREIGN PATENT DOCUMENTS

| | | |
|---|---|---|
| 0287334 | 10/1988 | European Pat. Off.. |
| 0398521 | 11/1990 | European Pat. Off.. |
| 0407067 | 1/1991 | European Pat. Off.. |
| 55-25820 | 2/1980 | Japan ................. G11C 29/00 |
| 235262 | 11/1987 | Japan ................. G06F 12/08 |
| 0176240 | 3/1989 | Japan ................. G06F 12/08 |

*Primary Examiner*—Robert W. Beausoliel, Jr.
*Assistant Examiner*—Albert Decady
*Attorney, Agent, or Firm*—Kerkam, Stowell, Kondracki & Clarke; Edward J. Kondracki

[57] ABSTRACT

The memory (DAT) with blocks (BL) organized in N columns of n levels is managed by a method consisting of prohibiting access to blocks that are unusable because of operating defects, by associating the unusable blocks with a flag (F) advantageously incorporated into the addresses of the blocks. When these addresses incorporate at least two bits combined to indicate the states of the block at that address, the flag (F) may be a free combination of these two bits.

23 Claims, 9 Drawing Sheets

INTEGRATED MEMORY, METHOD FOR MANAGING IT, AND RESULTANT INFORMATION PROCESSING SYSTEM

The invention relates to a method for managing an integrated electronic memory that may include defects, the resultant memory, and the system employing this method. More particularly, the invention applies to information processing systems and to the cache memories of such systems.

An information processing system is made up of a central subsystem that can communicate with one or more peripheral subsystems by way of input/output units. The central subsystem of a large system ordinarily includes several processors connected by a bus to a central memory and the input/output units.

The function of each processor is to execute the instructions of the programs contained in the central memory. These instructions and the data necessary for executing them are accessible by the processor by using the addressing means of the central memory. However, given the relatively long access time in the central memory, the processors are typically provided with a cache memory that is much faster but with contents limited to a certain number of extracts from the contents of the central memory. A cache memory is composed of a data memory and a directory of addresses of the memory data. The data memory is generally embodied by a static random access memory (SRAM) and constitutes a multilevel associative memory with levels. It is divided into blocks each of the same predetermined size and each corresponding to one quantum of exchange with the central memory. The blocks are organized into N columns of n levels. N consecutive blocks constitute one page of the cache memory, which accordingly contains a total of n pages. The address of a block in a page accordingly corresponds to a column. However, a block at a given address may be placed in any level of the column. The level of a block is determined by performing a comparison with the addresses of the pages of the column. In order to shorten the duration for searching a block, a small number of levels, ordinarily two or four, is assigned to each column.

A processor is made up of various processing circuits. A description of these circuits adapted to a microprogrammed processor may be found in European Patent Application A-0434483, corresponding to U.S. Ser. No. 07/620,130 of DOLIDON et al., filed Nov. 30, 1990, for "Process With Multiple Microprogrammed Processing Units", filed by the assignee of the present application for example. In this reference, the processors were connected by way of their cache memory to a bus, enabling them to communicate with the memory. Each processor and its cache memory resided together on the same printed wiring board connecting a plurality of integrated circuit packages.

Because the capacity to integrate circuits is ceaselessly increasing, it is now possible to integrate each processor in a chip and to associate a cache memory portion, called private cache memory, with it. The private cache memories are connected to an external cache memory part, known as shared cache memory and connected to the bus. A private cache memory is also composed of a data memory and an address memory.

The invention relates to the problem presented by defects, faults or errors in the components and/or circuits of the memory. To overcome them, it is known to add reserve components in circuits and to reconfigure the circuits of the memory. The reconfiguration consists in disconnecting the defective part and replacing it by using the reserve circuits and components. In another solution, redundant functional parts such as memory blocks are added and used in place of the corresponding defective parts. A decoder is added to the directory of the memory for the allocation of the redundant parts.

Both these solutions have the disadvantages of adding components and circuits and consequently of congesting the useful surface area of the memory. To increase the performance of an integrated circuit, designers always seek to make maximum profit from the useful surface area, and they are reluctant to give up part of the surface area to make up for possible later defects in the memory. This is true particularly for a memory associated with a processing circuit in the same integrated circuit, such as that of the above example. In that example, the cache memory occupies approximately two-thirds of the surface area and must leave enough space for the processor. Reconfiguring the circuits has the further disadvantage of employing sophisticated, expensive and time-consuming techniques, in particular such as those for connection and disconnection by laser, or even of adding switch elements in the memory for the connection and disconnection of certain parts of the memory. Redundancy has the still further disadvantage of complicating the directory decoder in order to modify addressing in the activated reserve elements.

The invention overcomes these disadvantages by making it possible to use a memory that includes defects without having to add supplementary components and/or circuits and without complicating the directory.

The method according to the invention for managing a memory with blocks organized in N columns of n levels, characterized in that it consists in prohibiting access to blocks that are unusable because of operating defects, by associating the unusable blocks with a flag (F).

The integrated memory that results from the employment of the method of the invention is characterized in that some blocks of this memory are not used.

More particularly, the invention applies to an information processing system including at least one processor provided with a cache memory communicating with a central memory and including a data memory and an address directory, characterized in that the data memory is the memory defined above.

The characteristics and advantages of the invention will become more apparent from the ensuing description, given by way of example and taken in conjunction with the accompanying drawings.

Figure 1:
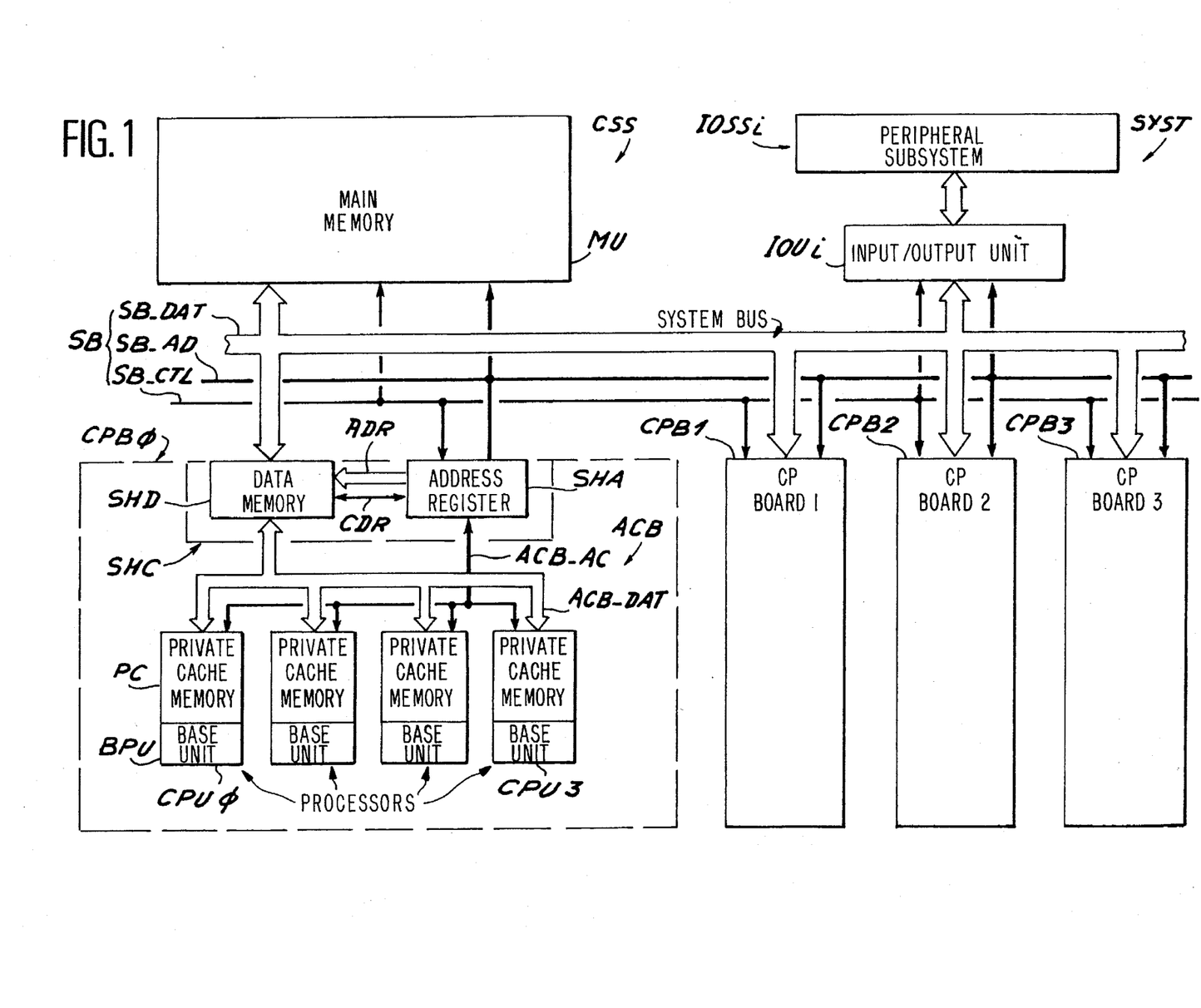
FIG. 1 is a block diagram of an information processing system according to the invention, including processors each of which includes a private cache memory according to the invention, which is managed by the method of the invention.

FIG. 1 is a block diagram of an information processing system SYST including a central subsystem CSS according to the invention, connected to a plurality of peripheral subsystems IOSSi. The central subsystem CSS includes a main memory MU connected to a system bus SB for communicating with 16 processors CPU (CPU0, CPU1, etc.) and with input/output units IOUi connected to the respective peripheral subsystems IOSSi. The bus SB is composed of a data bus SB-DAT, an address bus SB-AD, and a control bus SB-CTL. The sixteen processors CPU are distributed among four boards CPB (for central processor board) CPB0–CPB3, each with four processors. On each board CPB, each of the four processors CPU0–CPU3 is made of a VLSI circuit (for very large scale integration) including a private cache memory PC and a base processing unit BPU, as shown particularly on the board CPB0. Each board CPB also carries a shared cache memory SHC connecting the system bus SB to a processor bus ACB connected to four private cache memories PC of the processors CPU. The processor bus ACB includes a data bus ACB-DAT and a multiplexed and control bus ACB-AC. The shared cache memory SHC is composed of a data memory SHD and an address register SHA. The data memory SHD is connected to the data bus SB-DAT of the system bus SB and to the four private cache memories PC by way of the data bus ACB-DAT. The register SHA connects the address bus SB-AD and the control bus SB-CTL of the system bus SB to the multiplexed address and control bus ACB-AC of the processor bus ACB. The register SHA controls the data memory SHD via address lines ADR and internal control lines CDR.

Figure 2:
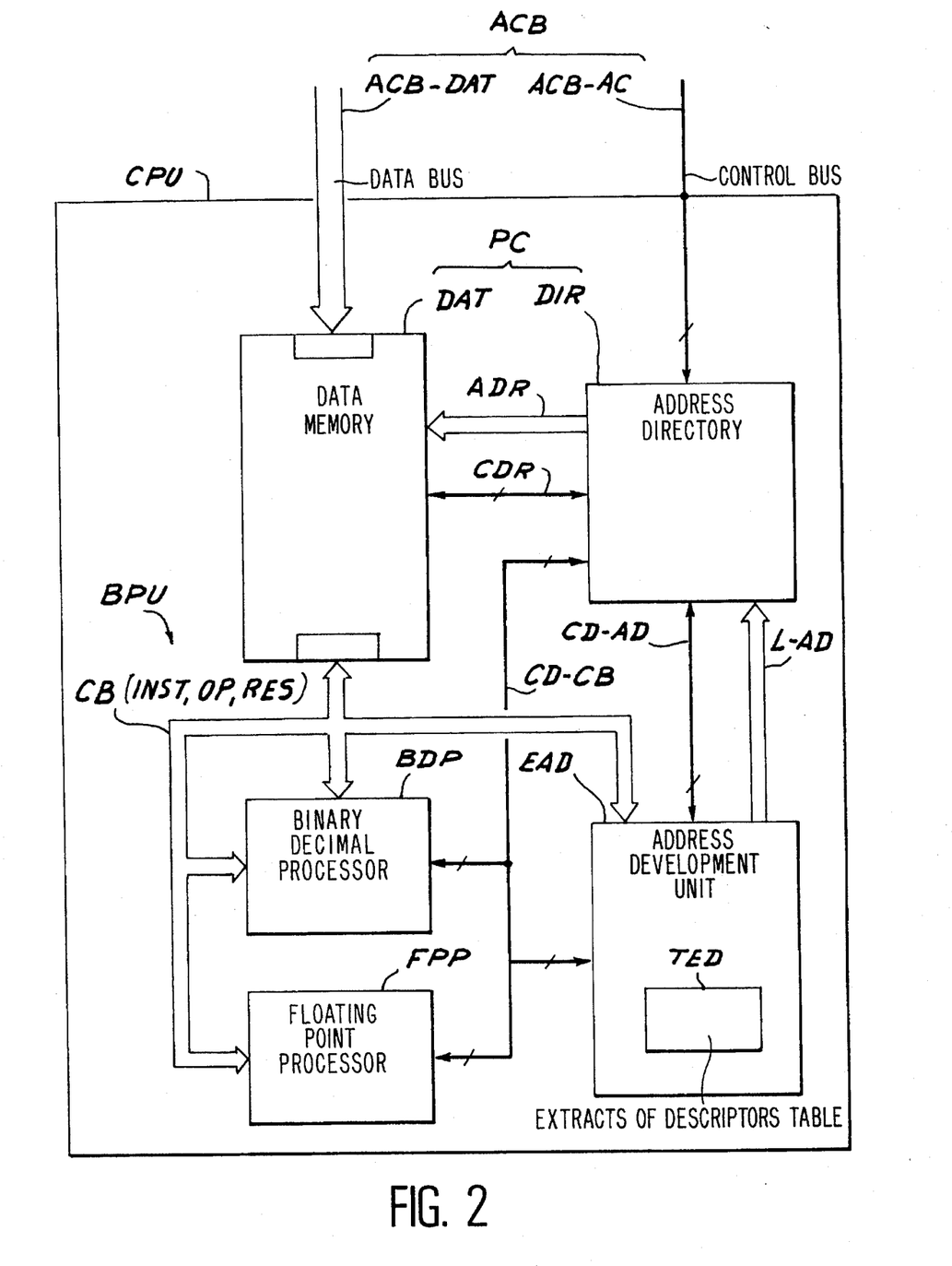
FIG. 2 is a block diagram of a processor of the information processing system shown in FIG. 1.

FIG. 2 schematically illustrates the structure of one of the 16 processors CPU of a board CPB of the central subsystem CSS. The private cache memory PC is composed in the conventional way of a data memory DAT and a directory DIR of the addresses of the data in the memory DAT. The memory DAT is typically an associative memory made of blocks organized in N columns of n levels. The number n of levels is determined by the ratio of the total capacity of the memory DAT to the product of the number N of column with the size of one block. The memory DAT exchanges data with the processor bus ACB by way of the data bus ACB-DAT. The directory DIR communicates with the other three processors of the board and with the address register SHA of the shared cache memory SHC by way of the multiplexed address and control bus ACB-AC. In addition, as in the shared cache memory SHC, the directory DIR controls the memory DAT via address lines ADR and internal control lines CDR.

The base processing unit BPU of each processor shown includes three execution units of the processor: a unit EAD (for effective address development) for translating virtual addresses into real addresses and for addressing the private cache memory PC; a unit BDP (for binary-decimal processor) for binary and decimal calculation; and a unit FPP (for floating point processor) for calculating a floating point. These three units are connected to one another and to the memory DAT via an internal bus CB. The internal bus CB includes a bus INST for transmitting the instructions sent by the memory DAT, a bus OP for transmitting the operands sent by the memory DAT, and a four-byte bus RES for writing the results in the memory DAT from one of the three units EAD, BDP, and FPP or for the exchange of results among these three units. In particular, the unit EAD is specifically assigned to the addressing operations, in particular for obtaining instructions and operands from the private cache memory PC. It incorporates a table of extracts of descriptors TED, for calculating the real addresses AD that it sends to the register DIR over address lines L-AD. It also exchanges addressing control signals CD-AD with it. The register DIR reacts to the signals CD-AD to control the memory DAT by way of the lines ADR and CDR. The memory DAT can accordingly exchange the instructions, operands and results with the units EAD, BDP and FPP by way of the internal bus CB. Since these units can autonomously execute their own microprogram in each processor CPU, they are connected to one another and to the register DIR via control lines CD-CB for the synchronization of coherence of the operations that they perform. This example is purely illustrative of a preferred embodiment of a processor suitable for employing the inventions. For the sake of clarity, FIGS. 1 and 2 do not show the clock circuits and maintenance devices. An example of microprogrammed operation of a similar structure of a central information processing subsystem may be found in the aforementioned reference EP-A-0434483, (U.S. Ser. No. 07/620,130).

Figure 3:
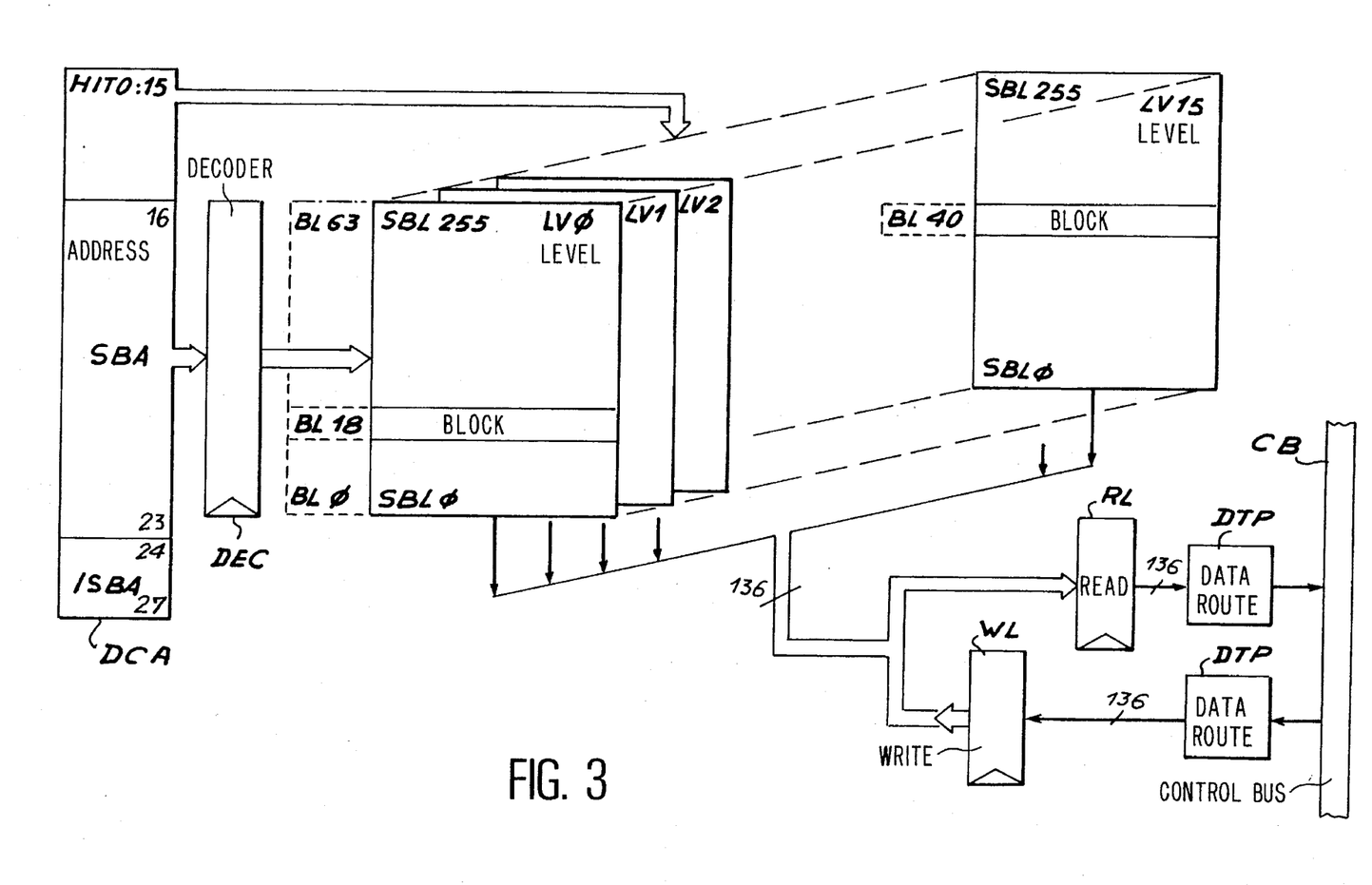
FIG. 3 schematically illustrates an example of organization of the data memory of the private cache memory of the processor shown in FIG. 2.

The preferred embodiment of the method for managing the cache memory PC will now be described, by way of example, in conjunction with FIGS. 3–6. FIG. 3 illustrates the organization of the memory DAT, which has a total capacity of $2^{16}$ bytes, or in other words 64 kb. It is organized into 64 columns each of 16 levels LV0–LV15. Each level accordingly contains 64 blocks BL0–BL63, each have a size of $2^6$ bytes, or in other words 64 bytes, and one column is made of 16 corresponding blocks in the 16 levels. For example, column 12 is composed of 16 blocks BL12, each of 16 levels LV0–LV15. Each of the 64 blocks is composed of four subblocks SBL of 16 bytes each, thus defining 256 subblocks SBL0–255 in each of the 16 levels LV0–LV15. The memory DAT receives the addresses of the subblocks from the register DIR by way of the addressing lines ADR. FIG. 5 shows an example of these addresses, which carry the symbol DCA (for data cache memory address). The 16 first bits HIT 0:15 of the address DCA, which are not coded, will be discussed later and define the 16 levels LV0–LV15 of the memory DAT. These 16 bits are added to eight bits SBA 16:23 which represent the address of a subblock SBL, and to four bits ISBA 24:27 for addressing within a subblock. The eight bits SBA are decoded in the memory DAT by a decoder DEC. Each address DCA accordingly contains the information that the memory DAT needs in order to access the subblock that will furnish the data to the processing unit BPU by way of the bus CB. In the memory DAT, the data are furnished to 136-bit data lines (16 bytes representing the size of a subblock, plus one parity byte) associated with a writing register WL and a reading register RL, connected respectively to data routes DTP serving as interface circuits with the bus CB.

Figure 4:
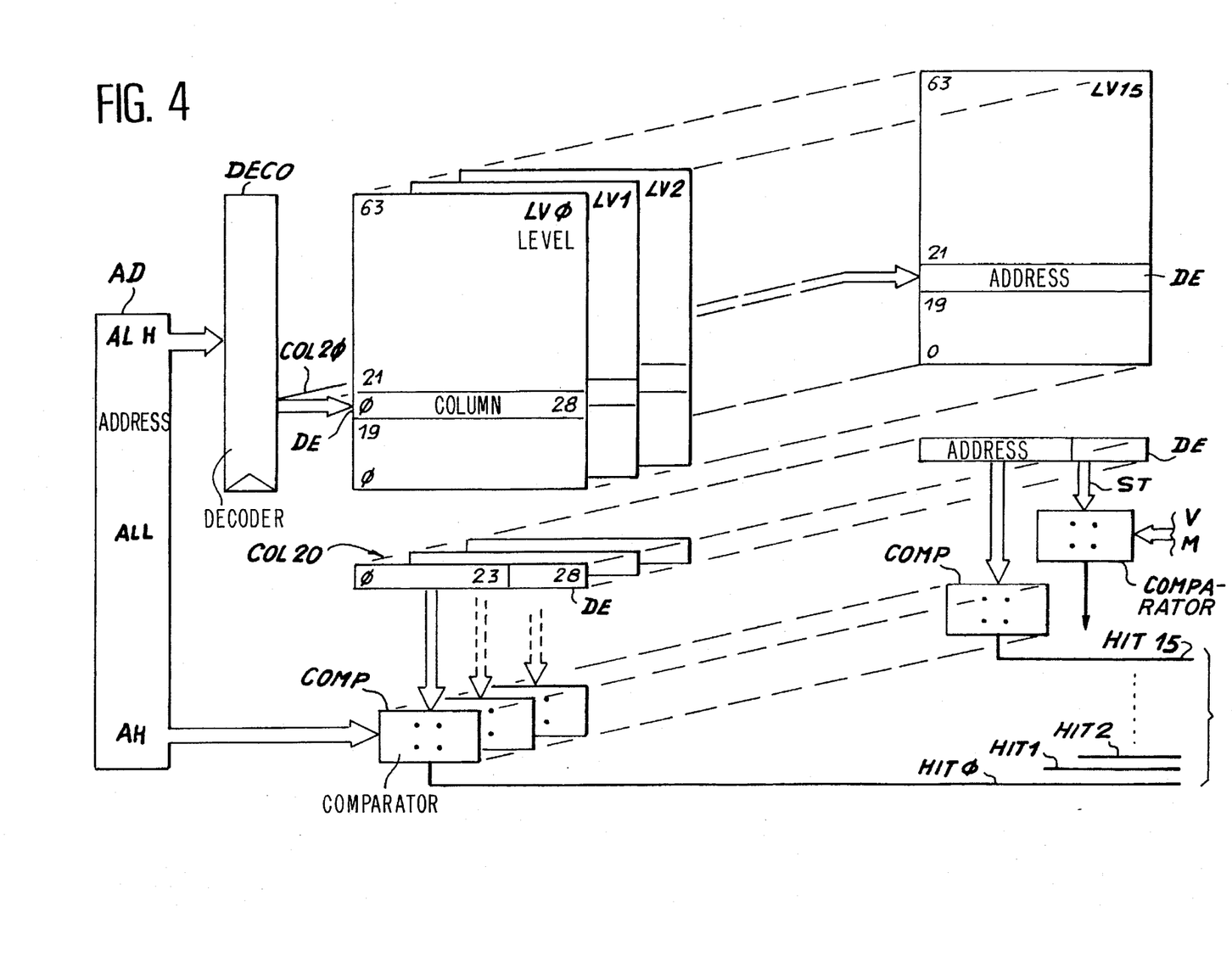
FIG. 4 schematically illustrates an example of organization of the address register of the private cache memory of the processor shown in FIG. 2.
Figure 5:
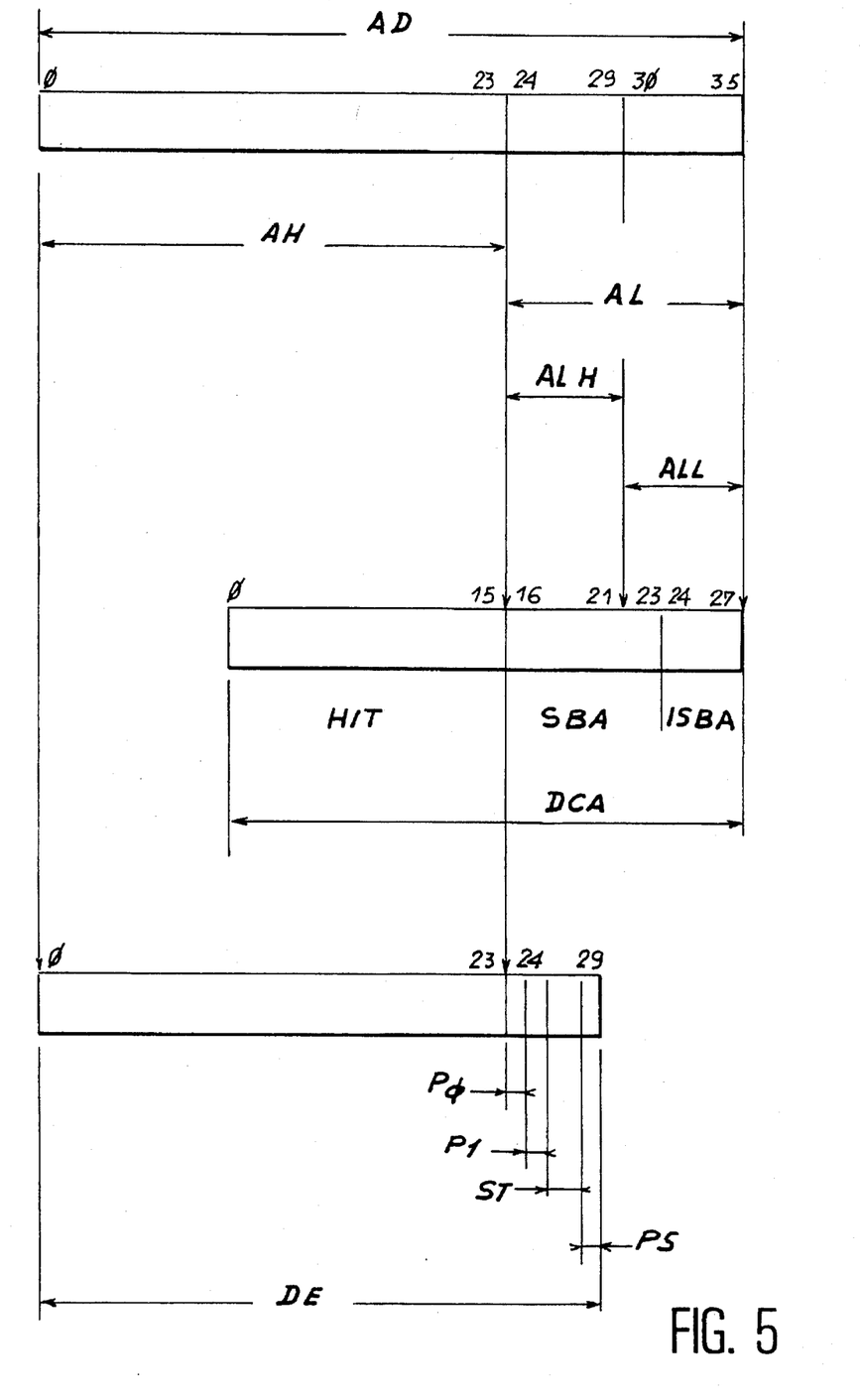
FIG. 5 shows the structure of the addresses employed in the cache memory shown in FIGS. 3 and 4, and their relationships with one another.

FIG. 4 schematically illustrates the organization and operation of the register DIR. The register DIR shown is a random-access memory provided for storing the addresses DE of the blocks of the memory DAT. The memory of DIR is accordingly also composed of blocks organized into 64 columns COL0–63 of 16 levels LV0–LV15 each and provided for storing the respective addresses DE of the blocks BL of the memory DAT. The addresses DE stored in the register DIR originate in the addresses AD that the register receives from the unit EAD.

FIG. 5 shows an exemplary address AD furnished by the unit EAD to the register DIR for addressing a block. The address AD includes a high address AH made of most significant bits, and a low address AL made of least significant bits. The high address AH is composed of 24 bits 00:23 furnished by the unit EAD after processing in its table of extracts of descriptors TED. The high address AH defines the page in which the block is located. The address AD illustrated assumes that each page of logical memory has a size of $2^{12}$ bytes, hence 4 kb. The unit EAD furnishes the 12 bits 24:35 of the low address AL, which correspond to the power of the $2^{12}$ bytes of the logical memory page size, without transformation and hence rapidly. The low address AL is divided into six high address bits ALH 24:29 for addressing the block in the page, and six low address bits ALL 30:35 for addressing inside a block.

FIG. 5 illustrates the formation of the address DCA of a subblock of the memory DAT from the address AD. It has been seen that the register memory DIR is organized into blocks of 64 bytes, and that in the memory DAT the blocks BL are each broken down into four subblocks SBL of 16 bytes each. For addressing one subblock SBL in the memory DAT, the 12 low address bits AL are accordingly divided into eight most-significant bits comprising the address SBA of the subblock and four least-significant bits comprising the address ISBA within the subblock.

FIG. 5 also illustrates an exemplary address DE (for directory entry) that the register DIR stores after receiving the address AD furnished by the unit EAD. The entry address DE is composed of an address field formed of 24 bits 00:23 of the high address AH of the address AD, one bit 24 for the parity P0 of the bits 00:11 of the address field, one bit 25 for the parity P1 of the remaining bits 12:12 of the address field, two bits 26, 27 representing the state ST of the block, and one bit 28 for the state parity PS. In the conventional way, the state ST is determined by the two bits called V (for valid) and M (for modified), defining three states in the manner shown in FIG. 6: one valid copy state 10 when the private cache memory PC has the same copy of the block that is located in the shared cache memory SHC, where the same copy may be located in other private cache memories PC of the processors CPU; one valid modified copy state 11, if the private cache memory PC is the only one that has the copy of the block that it has modified (the copies that are located in the other private cache memories PC or in the shared cache memory SHC or in the central memory MU not having been updated); and an invalid copy state 00 when the private cache memory PC has previously had a copy of the block but has lost it, for example if another processor CPU has overwritten this block in the meantime. The parity state bit PS is the result of the sum by an exclusive OR operation of the bits V, M and the high part ALH of the low address AL. The entry address DE accordingly does not incorporate the low address AL received from the unit EAD. In practice, the register DIR manages blocks of 64 bytes each and can accordingly transmit the low part ALL of the low address AL directly to the memory DAT, while the high part ALH serves directly to address one column of the register DIR.

FIG. 4 illustrates the principle of operation of the register DIR. The six bits ALH of the low address AL of the address AD received from the unit EAD are decoded by a decoder DECO into 64 bits each designating one of the 64 columns COL0–63 where the address DE sought is located. This address is to be sought among the 16 addresses DE contained in the 16 levels LV0–LV15 of the column designated by the decoder DEC; in the example shown, this is column COL20. The search for the address is done by comparing the address field 00:23 of each of the 16 addresses DE of the column COL20 with the high address AH of the address AD in 16 comparators COMP. The 16 hits HIT0:15 accordingly define the level in which the block is located in the memory DAT. By way of example, it is assumed in FIG. 4 that the address is located in level LV15. The 16 hits HIT0:15 constitute the 16 first bits of the address DCA (FIG. 5) sent by the register DIR to the memory DAT. The bits HIT0–15 may be coded into a four-bit signal that will be decoded in the memory DAT. However, the time required for the coding and decoding delays their use by the memory DAT. The sending of the bits HIT0:15, which determine the level of the block in the memory DAT requested by the unit EAD (the level LV15 in the example shown), by the register DIR is done after verification of the state ST of the block BL in a comparator COMPA. In conjunction with FIG. 6, it has been seen that the state ST is defined by the two bits V and M of the address DE of the block BL. If the processor CPU seeks to read in the block BL in the memory DAT, it suffices if the block has a valid state (V=1). The comparator COMPA then verifies the value of the bit V in the address DE found by DIR. If V=1, the register DIR sends the memory DAT the address DCA for reading in the corresponding block. If V=0, or if none of the 16 comparisons done by the comparators COMP designates any block, the register DIR asks the shared cache memory SHC for the block sought BL by way of the bus ACB-AC (FIG. 2). In the memory DAT, the register DIR then searches for a level for storing the block BL that will be received from the shared cache memory SHC. It will be seen later that this level is selected by an operator, using a block replacement algorithm. If the state of the block BL to be replaced is V=1, M=1, then the private cache memory PC is the only one that has an updated copy of this block. It must then send the data of this block to the shared cache memory SHC, and this action is known as a "swap". The data of the new block BL are received from the bus ACB-DAT. The register DIR then sends the memory DAT the address DCA, so that the memory DAT will order this block and in the same block read the data to be sent to the processor CPU. Conversely, if the processor CPU seeks to write in the block BL of the memory DAT, then it must have a valid and unique copy of this block. The comparator COMPA then verifies the state of the bit V to learn whether the block is valid, and then it verifies the state of the bit M. If M=1, the writing can be done, and the register DIR sends the address DCA to the memory DAT. If M=0, the register DIR must assure itself that the other processor have not modified the copy that is in the memory DAT. If not, the writing can be done, and if so, then the register DIR acts to update the block before writing in the block.

As indicated in the memory DAT shown in FIG. 3, it is assumed that the block BL18 of level LV0 and the block BL40 of level LV15, in particular, have defects originating in production that make them unusable. A defect in a single subblock suffices to make this block be declared unusable.

Figure 6:
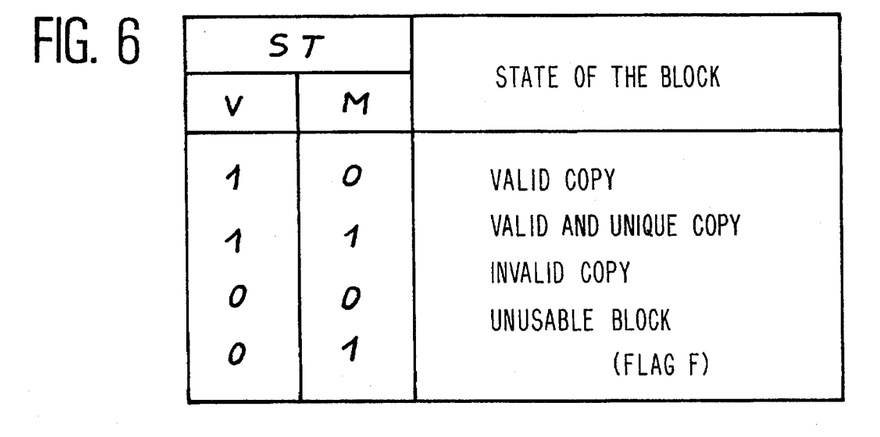
FIG. 6 shows an embodiment of the method according to the invention for flagging blocks in the data memory.

The invention consists in using the memory DAT with the defects, without replacement or repair of these defects. In a first characteristic of the invention, the presence of a defect in a site reserved for a block translates in the address into a flag F, meaning that this block is unusable. In the address DE shown in FIG. 5, the flag F is constituted by the unused combination 01 of the bits V and M defining the state ST of the block, as indicated in FIG. 6. In this case, the flag F is set only if the block is unusable. If it is functionally usable, then the bits V and M serve to indicate one of the three states ST of the block.

It is clear that the performance of the memory DAT depends on the number of its unusable blocks. Another characteristic of the invention consists in limiting the number of unusable blocks in a predetermined proportion. This proportion may refer to the total number of blocks in the memory DAT. In the present example, the choice has been to limit the number of unusable blocks to 10, which represents a percentage of approximately 1% unusable blocks in the memory DAT. However, if these ten blocks are located in the same column, then the six levels still available in that column would seriously limit the performance of the memory. Consequently, it is desirable to make a second limitation relating to the maximum number of unusable blocks in each column. Clearly, this limitation depends on the number of levels assigned to each column. If the memory DAT were organized in the conventional way in only two levels, for example, then the presence of one unusable block in a column would leave only a single level usable and would markedly lower the performance of the cache memory. Even with a conventional 4-level organization, while the choice would be greater it is nevertheless desirable in practice for the number of unusable blocks in a column to be a minimum of two, in order to take account defects in technology that overlap two blocks, for instance. This markedly lessens the numbers of unusable integrated circuits and makes the loss less expensive. In that case, 4-level organization would leave only two usable levels. 16-level organization as illustrated here affords a good compromise between the number of comparisons to be made, the performance desired, and the lowering of the cost of losses.

In any cache memory, replacement of the blocks is done by an algorithm selected form a plurality of possible types that are well known. In the example shown, the algorithm is known by the name LRU (for "least recently used"), which designates the block in DAT that was used longest ago as the block to be replaced. In the present case, it has been seen that if the processor makes a request for a block, it accesses the register DIR with the address of that block. The register DIR then makes a comparison in the 16 levels of the column, to see whether the block is present (FIG. 4). If this is successful, then there is no problem. If it is unsuccessful, the register DIR must search for the block in the shared cache memory SC, which is that memory does not have it will search for it in the main memory MU. During that period of time, the algorithm LRU chooses a level from among the number of possible levels. In a conventional associative memory, this number corresponds to the number n of the levels chosen for the organization of the memory. But in the memory managed in accordance with the method of the invention, there is no need for the algorithm to choose an unusable level. In a preferred solution, the register DIR sends the algorithm a mask of the 16 levels of the column. The mask contains the copy of bits V and M of the 16 addresses DE contained in the column. If the flag F of one or two unusable blocks is located in this mask, then the algorithm takes this into account in choosing the level reserved for the block that it is to receive.

In the exemplary embodiment shown, the flags F are disposed in the addresses DE stored in the random access memory of the register DIR. Consequently, the flags F are lost along with the addresses DE each time there is an interruption in operation of the central subsystem CSS. Hence it is necessary to set the flags F each time the central subsystem CSS is initialized. For example, they could be extracted from a small internal or external read-only memory of the private cache memory PC or of the integrated circuit incorporating it, for example associated with the shared cache memory SHC. In that case, the algorithm LRU could simply consult this small read-only memory and would not need the mask sent by the register DIR.

The description of the preferred embodiment of the invention clearly suggests to one skilled in the art that the invention may be the subject of numerous variants and applications. For example, it is clear that the invention could equally well be applied to the shared cache memory SHC as to any kind of cache memory of one or more processors of an information processing system. However, a cache memory is an associative memory with levels, such that the method of the invention can be applied in the same way to any associative memory with levels. More generally, the blocks arranged in a matrix-grid in the memory DAT could equally well be cells of the memory, and it is then clearly apparent to one skilled in the art that the management method of the invention may equally well apply to an associative memory or an addressable memory. The blocks used in the foregoing description thus have a more general meaning and may be cells of an addressable or an associative memory. The register DIR would then be the control circuit of the memory.

Consequently, and in general, when a memory employs the invention, there are blocks (or cells) that cannot be used. Additionally, the memory may include flags F that represent the nonuse of these blocks. In the example shown, these flags are included in the addresses of these blocks. However, it has been seen that they may be incorporated in a read only memory external memory, or even in the integrated circuit that incorporates it. The read-only memory may be read each time an address is requested by the unit EAD, or more advantageously, its contents may be read when the system SYST is initialized, so that it is then introduced into the addresses of the register DIR, and in the case of a cache memory can be furnished to the block replacement algorithm. In addition, the flag F made in the example shown would advantageously use a free combination of the two bits V and M indicating the state ST of the associated block. However, it is clear that the flag could also assume the form of a supplementary bit F in each address DE. In this case, the two values of the bit F would indicate that the block is usable or not usable. The comparator COMPA would begin by verifying the value of the bit F before looking for the state ST of the block. The mask sent by the register DIR to the algorithm LRU would contain only the bits F. Finally, the proportion indicated in the example shown may vary and may assume various forms depending on the usage of the associative memory. It could bear simply on all of the blocks, or on a predetermined number of unusable blocks in each column, or on some other criterion specific to the operation and/or context of use of the memory, for example.

The flagging of the unused blocks can be done in different ways. The invention introduces one preferred embodiment of a self-testing method of the memory DAT, for writing the flags F in the addresses of the unused blocks in the form described in conjunction with FIG. 6.

Figure 7:
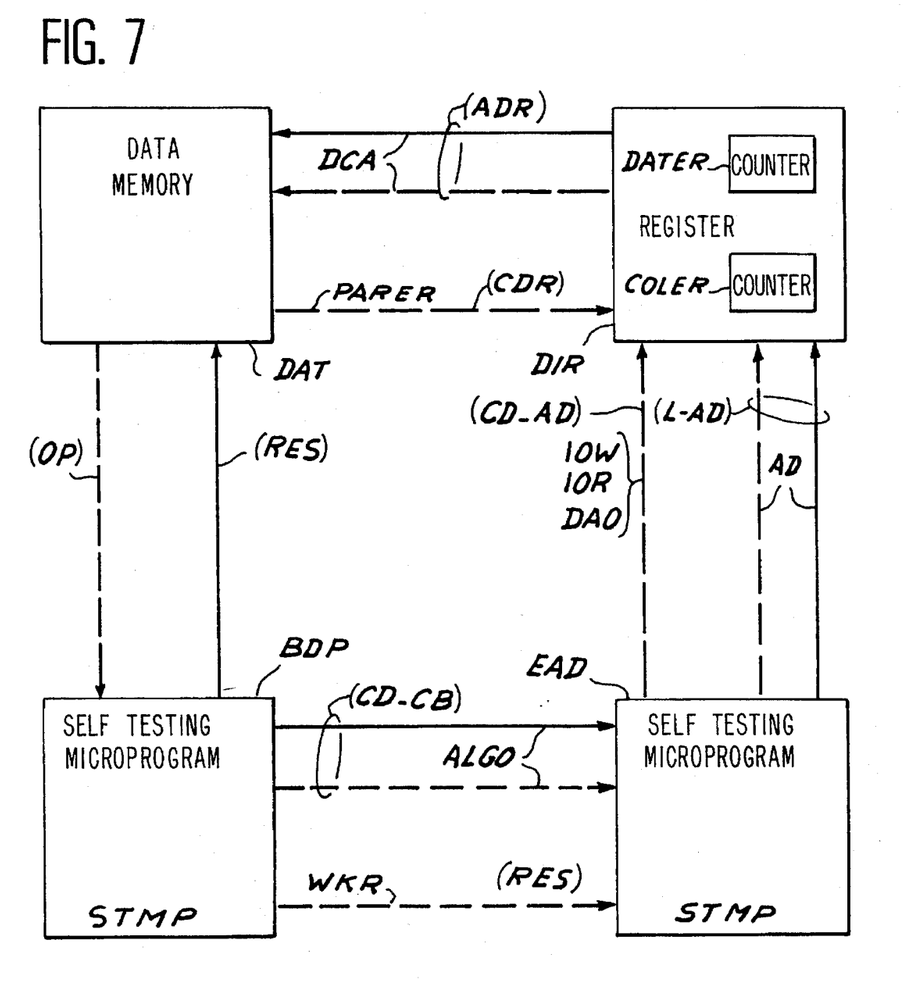
FIG. 7 schematically shows the links existing between the data memory and the register of the cache memory and the units EAD and BDP of the processor for employing the self-testing procedure serving to effect the flagging of the method according to the invention.

It has been seen that the base processing unit BPU of a processor CPU of the system SYST shown by way of example was microprogrammed in accordance with EP-A-0434083, (U.S. Ser. No. 07/620,130) to control the normal operation of the processor. The embodiment of the self-testing procedure that will now be described in conjunction with FIGS. 7, 8 and 9 advantageously uses self-testing microprograms STMP added to the microprograms that control the normal operation of the base unit BPU of each processor CPU. The description of the self-testing procedure will be made first with reference to FIG. 7, which schematically illustrates the self-testing operations performed by the memory DAT, the register DIR, and the self-testing microprograms STMP of the units EAD and BDP of the base processing unit BPU. FIG. 7 summarizes the hardware elements indicated in the processor described in conjunction with FIG. 2. Found in FIG. 7, indicated between parentheses, are the address lines ADR and control lines CDR between the memory and the register DIR, the address lines L-AD and the control lines CD-AD between the unit EAD and the register DIR, the control lines CD-CB between the units EAD and BDP, and in the internal bus CB the bus RES used to transmit the results to be written in the memory DAT from the unit EAD or BDP, in the example shown the unit BDP, and the bus OP for reading operands from the memory DAT to the unit EAD or BDP. The signals involved in the self-testing procedure illustrated are indicated next to these lines and buses RES and OP.

The self-testing procedure begins with a first test, verifying whether all the blocks BL0-BL63 of the memory DAT do not have parity errors or predetermined data writing errors. In practice, these data advantageously correspond to two low address motifs AL alternating between two adjacent subblocks SBL0-SBL255 of each level LV0-LV15. For example, since it is known that a subblock has 16 bytes the data AA for each of the bytes are assigned to the even-numbered addresses AL0, AL2, AL4, etc., and the data 55 are assigned to the odd-numbered addresses AL1, AL3, etc. The first test includes two phases.

Phase 1 is a writing phase, illustrated schematically by solid lines in FIG. 7. The self-testing microprogram STMP of the unit EAD furnishes the register DIR with a writing instruction IOW for writing the low address AL, then the high address AH of an address AB of a block BL of the memory DAT. The self-testing microprogram STMP of the unit BDP synchronizes that of the unit EAD with a signal ALGO and furnishes the data of the block to the memory DAT. These operations are repeated in a loop, assuring that the data will be written in all the blocks of the memory DAT.

Phase 2 is a reading and testing phase, represented schematically in FIG. 7 by dashed lines. The self-testing microprogram STMP of the unit EAD is synchronized by the signal ALGO output by the unit BDP and successively furnishes the register DIR with all the addresses AD of the blocks BL of the memory DAT and the reading instructions IOR for reading the data in the respective blocks. The memory DAT reads the data at each address, communicates these data to the unit BDP via the bus OP, verifies the parity of the data, and transmits any parity error PARER to the register DIR over the control lines CDR. The unit BDP compares the data read with the corresponding written data and communicates the results WKR to the unit EAD, which transmits them to the register DIR via a command DAO. In return, the hardware of the register DIR writes in the addresses DE the flags F relating to the blocks of DAT in which a data or parity error has been confirmed, in the manner described in conjunction with FIG. 6. The hardware of the register DIR also manages two error counters: one counter DATER of all the blocks that are unusable in the memory DAT, and one counter COLER of all the blocks that are unusable in each column. The counter COLER is reset to zero upon each change of column in the register DIR. If one of the counters exceeds the aforementioned limits, then the integrated circuit is considered nonfunctional and is scrapped.

The self-testing procedure continues with a second test, performed with the complementary values of the above data. This second test includes two phases 3 and 4, which are identical to the respective phases 1 and 2 and bear on these complementary values. Hence this second test likewise offers the advantage of being simple and fast to perform, with alternative motifs of values complementary to those of the first test. However, since the parities are identical for the data of complementary value, the two above rests do not change the parity. The self-testing procedure accordingly includes a third test that assures that the parity changes it state so that it can be properly tested. This test includes two phases 5 and 6, respectively, which are identical to phases 1 and 2 but bearing on the data, assuring the change of parity. For example, it suffices for the last byte of each subblock to have the complementary value of the value of the other bytes. With respect to the data mentioned in the first two tests, the last byte is assigned the value 55, while the preceding bytes have the value AA, and the value AA when the preceding bytes have the value 55. This test can accordingly be done simply and rapidly.

However, these three tests (phases 1-6) still have a disadvantage. In these tests, two data alternate between adjacent subblocks. Consequently, if the address decoder DEC in the memory DAT is malfunctioning, it may write one of these data twice at the same address. For example, in seeking to write in phase 1 one of the two data (AA . . . or 55 . . . ) in the addresses AL0 and AL2, this value might be written twice in the address AL0, if the decoder DEC confuses the two addresses AL0 and AL2. Advantageously, this same test also makes it possible to verify whether the multiplexer of the levels controlled by the hits HIT0-15 is functioning properly and is not confusing two levels. In such a case, reading in the two addresses would produce the same datum, and the comparison would be adjudged to be good even though in reality the decoder is unable to access the address AL2. Hence the alternating test of these values cannot reveal this error. The self-testing procedure thus includes a fourth test, consisting in putting different data in each of the subblocks. In the example chosen, the 4096 subblocks of the memory DAT can receive a different datum by incrementing the value of the register representing the last four bytes of each subblock. The fourth test includes two phases 7 and 8, which are respectively similar to phases 1 and 2 but use the different data on the subblocks to detect any defect in operation of the decoder.

The self-testing procedure that has just been described still runs up against another problem. When the unit EAD makes a request to a subblock SBL of the memory DAT, it furnishes the register DIR with the address AD=AH+ALH+ALL of the block BL containing the subblock SBL. In other words, in the example illustrated, the unit EAD cannot give an order to the register DIR to write in a given level of the memory DAT. Writing in the subblock requires the address DCA that the register DIR forms from the address ALH, representing the column that contains the block, and from the high address AH for forming the 16 level bits HIT0-15. However, when the self-testing procedure begins, the random access memory of the register DIR, which in normal operation contains all the addresses of the blocks of the memory DAT, has an indeterminant content. Consequently, if the unit EAD furnishes a given address AD to the register DIR when phase 1, writing, of the self-testing procedure begins, there is a strong likelihood that the comparison in the register DIR will not succeed in determining the level bits HIT0-15. This determination would then be made by the algorithm LRU and would evade any control necessary in order to assure that the self-testing has indeed taken place for all the blocks of the memory DAT. The solution proposed consists in initializing the random access memory of the register DIR, at the beginning of the self-testing procedure, by furnishing this memory with all the high addresses AH corresponding to the 1024 blocks in the memory DAT and proceeding such that these high addresses AH corresponding to the addresses of the requests by the unit EAD. Since there are only 1024 blocks in the memory DAT shown, it suffices to use a portion of the 24 bits of the high address AH shown in FIG. 5 to accomplish the proposed initialization. For example, by using the 16 most significant bits AH0:15 of each address AH, the first request by the unit EAD will be AH0+AL, the second will be AH1 +AL, . . . , and the sixteenth will be AH15+AL. In this way, all the blocks to which the unit EAD will gain access, with their addresses AD, will be present in the cache memory, and their data can be compared to furnish the signals HIT 0:15. In practice, a four-byte register REG, available in the unit EAD shown, has been used to make the initialization of the register DIR. Another solution would consist in making direct access possible by the unit EAD to the levels of the register DIR. That could be done by using a 16-bit bus or a scan path between the unit EAD and the register DIR.

The preferred embodiment for executing the self-testing procedure according to the invention will now be described in detail in conjunction with FIGS. 8 and 9A–9B, which are part of the present description. The flow charts in FIGS. 8 and 9A–9B respectively illustrate the operation of the unit EAD and the unit BDP that execute their self-testing microprograms STMP. The two flow charts show the course of the writing phase and the reading-comparison phase of each of the four tests that the self-testing procedure described above is composed of. The self-test is terminated when the unit EAD has gone through the flow chart of FIG. 8 four times, under the control of the unit BDP, which runs through the flow chart of FIGS. 9A–9B only once.

Figure 8:
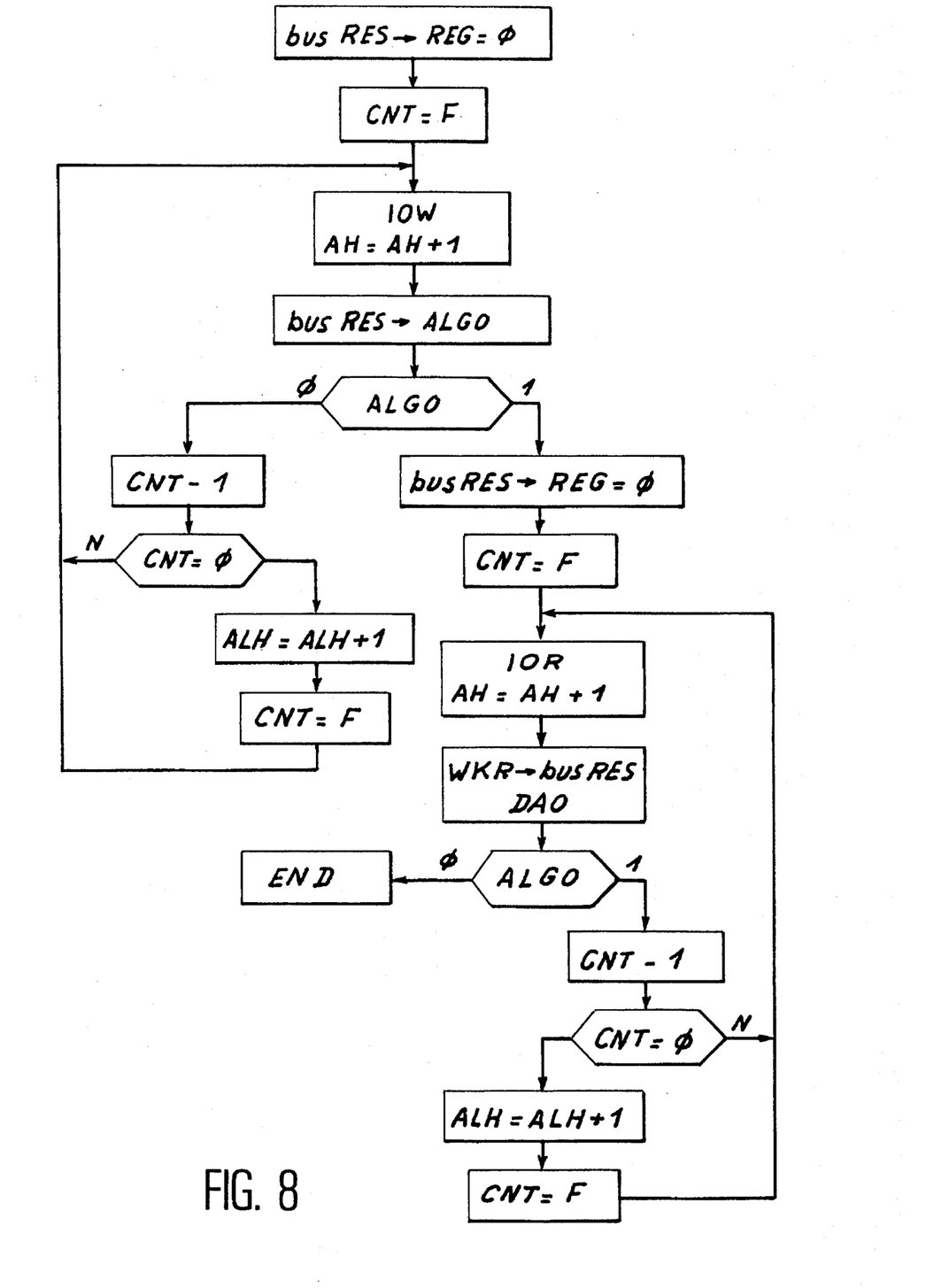
FIGS. 8 and 9A–9B, respectively, show execution flow charts for the units EAD and BDP for employing the self-testing procedure described in conjunction with FIG. 7.
Figure 9A:
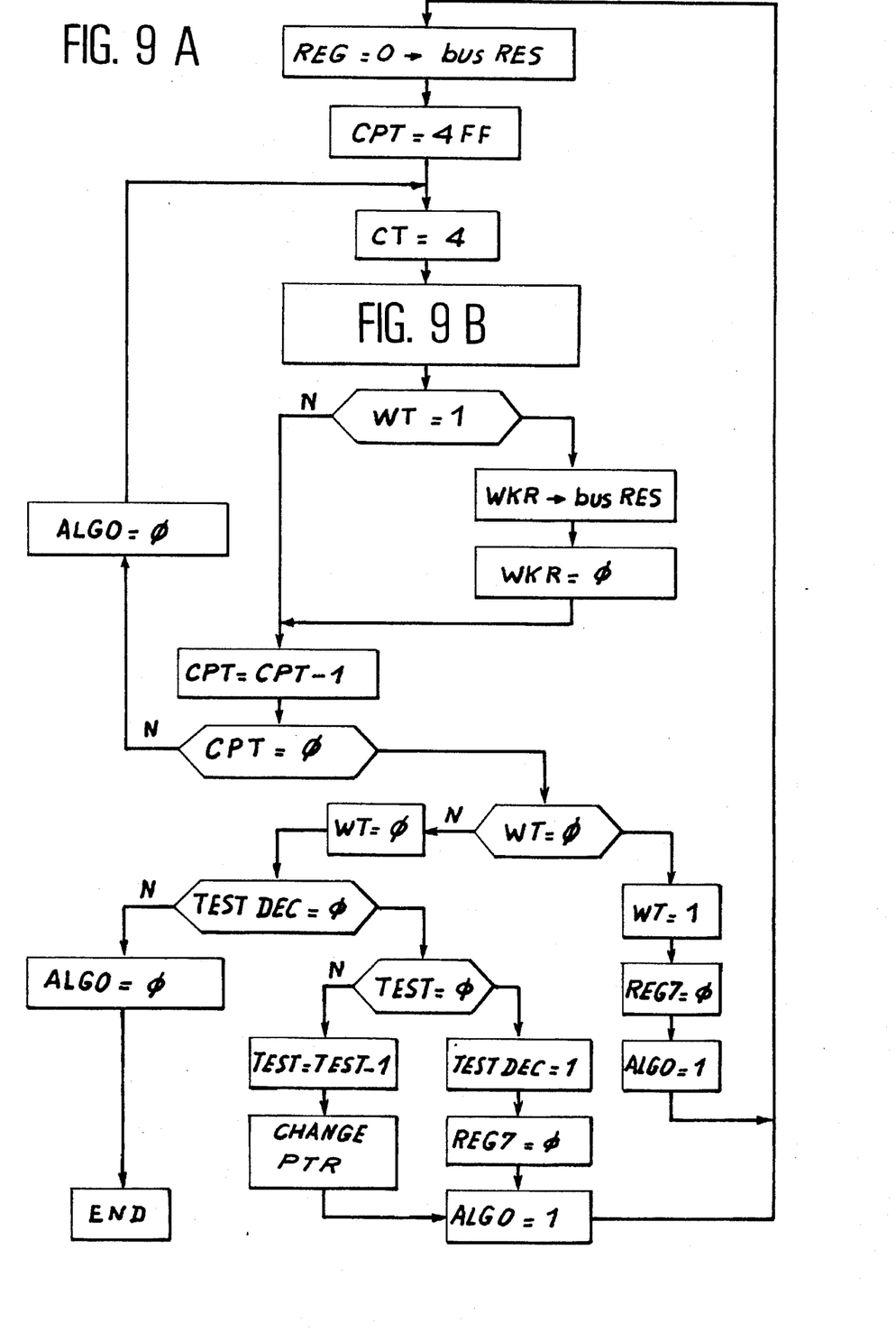
Figure 9B:
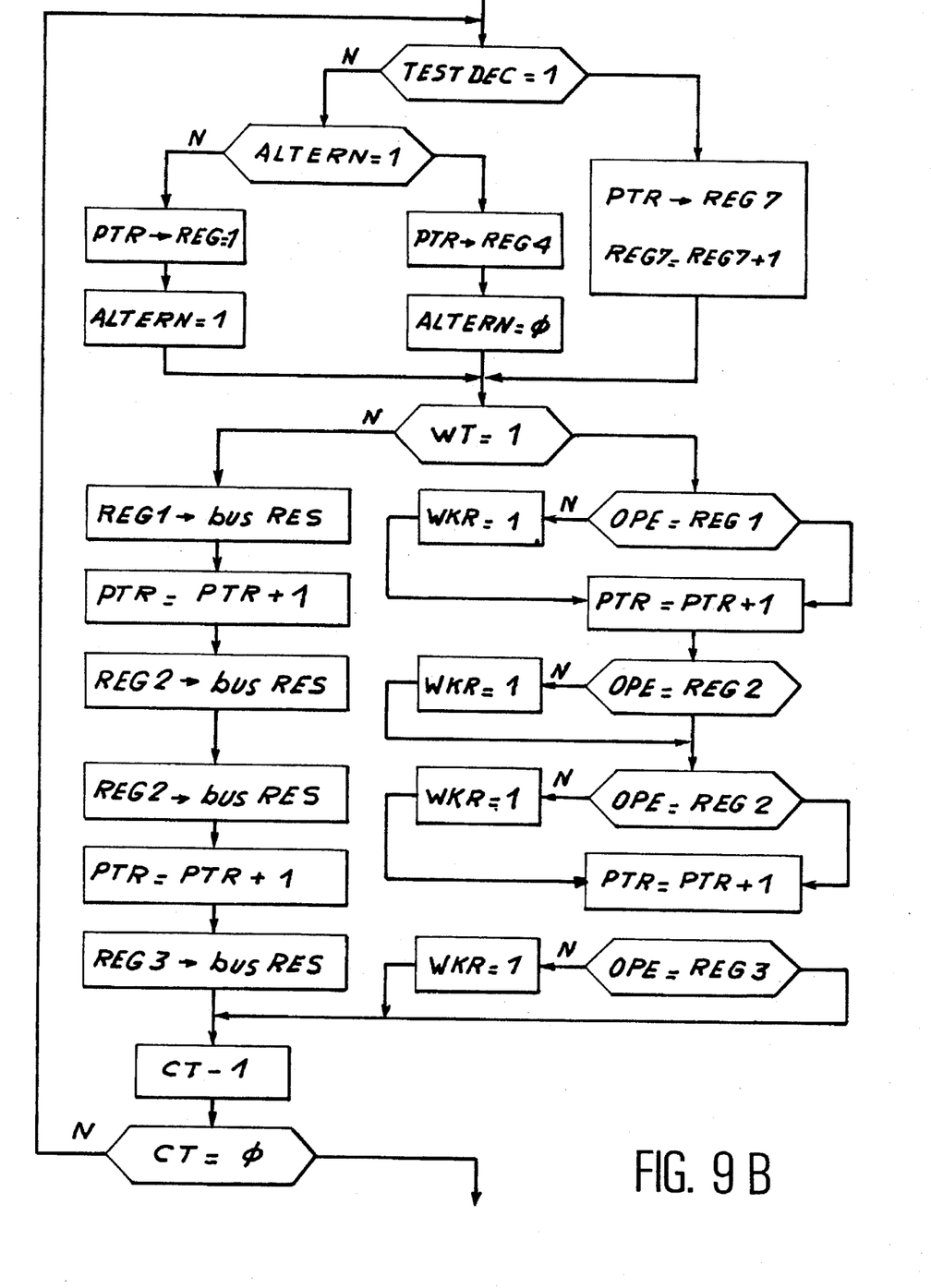

With respect to FIG. 8, phase 1 of the first test begins with the initialization of the contents of the register REG. These contents are sent by the unit BDP by way of the bus RES. A counter CNT is initialized to the logical value F representing the 16 levels LV0–LV15 of the register DIR. For writing in the level LV0 in the column of the blocks BL0 of the memory DAT, the unit EAD sends the register DIR the 64-byte writing instruction IOW. The unit EAD waits to receive the synchronizing signal ALGO from the unit BDP, and upon receiving it verifies its value. The value 0 represents the writing phase, and the value 1 the reading-comparison phase. Since phase 1 is the writing phase, ALGO=0. The counter CNT is then decremented, and the unit EAD moves to the level LV1. The unit EAD issues a new writing instruction IOW, increments the high address AH, and waits for the signal ALGO. The writing cycle begins again, until the counter CNT=0, which indicates that the writing has been done in the sixteenth level LV15 of the column of the blocks BL0 of the memory DAT. The high part ALH of the low address AL is then incremented, to move to the column COL1 in the register DIR and write in the column of the blocks BL1 of the memory DAT. A new cycle of writing in all the blocks of this column begins again as before and is repeated until each has commanded writing to be done in all the blocks of the memory DAT. At that stage, the unit BDP sends the synchronizing signal ALGO=1, to begin phase 2 of the self-testing procedure. The high address AH is reset to 0 in the register REG, and the counter CNT is reset to its initial logical value F. The unit EAD sends the register DIR a reading instruction IOR and the high address AH for reading in the level LV0 of the column of the blocks BL0 of the memory DAT. The unit EAD receives the results of the comparison made by the unit BDP and transmits them to the register DIR via a command DAO. The unit EAD also receives the synchronizing signal ALGO from the unit BDP. Since in this stage ALGO=1, the counter CNT is decremented, and the reading-comparison cycle is repeated until the counter CNT=0, which means that the reading-comparison has been done in all the blocks BL0. The unit EAD thereupon increments the address ALH and resets the counter CNT to its initial value F, to furnish the necessary addresses for the reading-comparison of all the blocks of the next column. When the unit EAD has furnished the register DIR with all the addresses of the blocks of the memory DAT, the unit BDP sends the synchronizing signal ALGO=0, indicating the end of phase 2 of the self-testing procedure and preparing the procedure for the writing phase of the second test. The unit EAD begins again at the beginning of the flow chart to perform the second, then the third and finally the fourth test of the self-testing procedure in the same way.

Turning to FIG. 9, the self-testing procedure executed by the unit BDP begins with the sending of the zero base address of the register REG to the unit EAD, by way of the bus RES. A counter CPT is initialized at the logical value 4 FF for counting the 1024 blocks of the memory DAT. A second counter CT is initialized at the logical value 4 for counting the four subblocks SBL of each of the blocks of the memory DAT. The unit BDP next verifies the logic state of a signal TESTDEC relates to the test of the decoder performed in the fourth test of the self-testing procedure. Upon initialization, TESTDEC=0, which indicates that the first three tests of the self-testing procedure do not relate to the decoder. The unit BDP then verifies the logical state of a signal ALTERN commanding the alternation of the data between adjacent subblocks. It has been seen above with reference to FIG. 7 that in phase 1 the data written in the subblocks were an alternation of complementary logical values A and 5. Upon initialization, ALTERN=0. The unit BDP then places the pointer PTR on a four-byte register REG1 (the bytes corresponding to the values A in phase 1) and ALTERN is set to the value 1. The unit BDP then verifies whether the self-testing procedure is in a writing phase, WT=0 (phases 1, 3, 5 and 7 of the procedure), or in a reading-comparison phase, WT=1. Upon initialization, WT=0, so that the contents of the register REG1 are sent over the bus RES to the memory DAT, and the pointer PTR is then incremented. The pointer is then placed on a register REG2, whose contents are sent twice over the bus RES to the memory DAT. The pointer PTR is incremented again to send the contents of a register REG3 over the bus RES to the memory DAT. At this stage, the bus has sent the data of 16 bytes of the first subblock SBL0 of DAT. The counter CT is decremented, such that the loop begins again at this level for the second subblock SBL1. For this subblock, ALTERN=1, such that the pointer PTR is positioned at a register REG4 (with logical values 5 in phase 1), and ALTERN is reset to the value 0. The loop continues as before. Once writing is completed in the four subblocks SBL0–SBL3 of the first block BL0, CT=0, and the unit BDP verifies whether the writing should continue. At this stage, WT=0, to command the writing in the second block. The block counter CTP is decremented, and the writing loop begins at the level of this counter, at the same time as the unit BDP sends the unit EAD the synchronizing signal ALGO=0. Once the writing in all the blocks is completed, CPT=0. At that stage, WT changes to 1, commanding the reading-comparison phase. A register REG7 is set to the value 0 for the sake of a decoder test, and the unit BDP sends the unit EAD the synchronizing signal ALGO=1. The operation of the unit BDP begins again at the beginning of the flowchart that has been described above. TESTDEC remains equal to 0 (phase 2 of the procedure), such that the operation of the unit BDP changes to a reading-comparison phase when it finds WT=1. ALTERN has been initialized to 0, so that the pointer PTR is placed on the register REG1 before being incremented. The four-byte data OPE that have been read in the first subblock SBL0 of the block BL0 of the memory DAT are compared with the contents of the register REG1 that have been written in this subblock. If OPE differs from REG1, then an internal register WKR is set to 1, to indicate the presence of an error. If OPE=REG1, then the pointer PTR is incremented, then and the next four bytes OPE are compared with the contents of the register REG2. The same is true for the next four bytes OPE. The pointer PTR is incremented to compare the last four bytes OPE with the contents of the register REG3. Each time, the register WKR is set to 1 if a comparison error has been found. The counter CT is decremented, and the loop begins again for the reading-comparison of the next subblock SBL1 of the block BL0. Once the test of the four subblocks of the block BL0 is completed, CT=0 and the unit BDP verifies whether it should continue the reading-comparison (WT=1). If so, it sends the unit EAD the contents of the defective register WKR over the bus RES and resets this register to 0. The unit BDP decrements the counter CPT of the blocks in the memory DAT and returns to the level of this counter in the flow chart in order to make the reading-comparison of the next block (BL1), at the same time as it sends the unit EAD the synchronizing signal ALGO=1. This loop is traversed again until the counter CPT=0. The unit BDP then resets WT to the value 0, to indicate that the next phase is a writing phase, and verifies whether TESTDEC=0. At that stage, the writing phase is phase 3 of the second test of the self-testing procedure, such that TESTDEC=0. It then decrements a test counter TEST initialized at the value 3 and changes the pointers for reading the registers REG1–4 of the next test. It has been seen in fact, in conjunction with FIG. 7, that the data of the second test are the complementary data to those of the first test. The unit BDP then sends the unit EAD the synchronizing signal ALGO=1 and begins again at the beginning of the flow chart. At the end of the second test, TESTDEC remains at 0, and the test counter TEST is decremented to begin the third test, which is the parity test. The pointers are changed so that the registers REG1–4 will have the data indicated in conjunction with FIG. 7, for example. The unit BDP sends the signal ALGO=1 to the unit EAD and returns to the beginning of the flow chart. At the end of the third test, the unit BDP finds that TESTDEC=0 and TEST=0, representing the last test relating to the decoder. It then sets TESTDEC equal to 1 and the register REG7 equal to 0, sends the signal ALGO=1 to the unit EAD, and returns to the beginning of the flow chart. When it finds TESTDEC=1, the pointer is placed on the four-byte register REG7 initialized to 0, and its contents are incremented. At that stage, WT=1 (writing phase 7), and the contents of the register REG7 are sent over the bus RES to the memory DAT. The last test then continues in the same way as the first three. The only difference resides in the use of the register REG7 instead of the registers REG1 and REG4, so as to write different data in all the blocks of the memory DAT. At the end of the test, the unit BDP sees that TESTDEC=1 and sends the unit EAD the synchronizing signal ALGO=0, to signify the end of the self-testing procedure.

We claim:

1. A method for managing a memory having blocks organized in N columns of n levels, comprising the steps of:

prohibiting access to unusable blocks that are unusable due to operating defects, by associating said unusable blocks with respective flags; and determining a number of n levels from a predetermined maximal number of said unusable blocks in each of said N columns;

and said determining step further comprises step of limiting a number of said unusable blocks in a predetermined proportion.

2. The method of claim 1, wherein said blocks have respective addresses and said flags are incorporated in the addresses of each of said unusable blocks.

3. The method of claim 1, wherein said flags are stored in an auxiliary memory.

4. The method of claim 1, wherein said flags are used by an algorithm for replacement of said blocks in said memory.

5. The method of claim 1, wherein said flags are associated with said unusable blocks by a self-test procedure of the memory.

6. A memory having blocks organized in N columns of n levels, comprising:

means for associating flags with unusable blocks, said unusable blocks being unusable due to operating defects;

means using said flags, for prohibiting access to said unusable blocks; and means for determining a number n of levels from a predetermined maximal number of said unusable blocks in each of said N columns;

wherein said determining means uses a predetermined proportion of unusable blocks.

7. The memory of claim 6, wherein said determining means comprises first means for counting said unusable blocks in each of said columns.

8. The memory of claim 6, wherein said determining means further comprises means for counting said unusable blocks in said memory.

9. The memory of claim 8, wherein said determining means further comprises means for counting said unusable blocks in said memory.

10. The memory of claim 6, wherein said blocks have respective addresses and said flags are incorporated in each of the addresses of the unusable blocks.

11. The memory of claim 6, wherein said flags are stored in an auxiliary memory.

12. The memory of claim 6, further comprising means for replacement of said blocks in the memory, said replacement means having an input for said flags.

13. The memory of claim 6, wherein said means for associating said flags with said unusable blocks uses a self-test procedure of the memory.

14. The memory of claim 13, wherein said memory is coupled to a processor having a base processing unit controlled by microprograms, said microprograms including self-testing microprograms for said self-test procedure.

15. An information processing system comprising:

at least one processor coupled to a cache memory having a data memory and an address directory;

said data memory having blocks organized in N columns of n levels and having means for associating flags with blocks that are unusable due to operating defects;

means using said flags for prohibiting access to said unusable blocks; and means for determining a number n of levels from a predetermined maximal number of said unusable blocks in each of said N columns;

wherein said determining means uses a predetermined proportion of unusable blocks in the memory.

16. The information processing system of claim 15, wherein said determining means comprises first means for counting said unusable blocks in said cache memory.

17. The information processing system of claim 15, wherein said determining means further comprises means for counting said unusable blocks in the data memory.

18. The information processing system of claim 15, wherein said determining means further comprises means for counting said unusable blocks in the data memory.

19. The information processing system of claim 15, wherein said blocks have respective addresses and said flags are incorporated in each of the addresses of the unusable blocks.

20. The information processing system of claim 15, wherein said flags are stored in an auxiliary memory.

21. The information processing system of claim 15, wherein said data memory further comprises means for replacement of said blocks in the memory, said replacement means having an input for said flags.

22. The information processing system of claim 15, wherein said means for associating said flags with said unusable blocks uses a self-test procedure of said data memory.

23. The information processing system of claim 22, wherein said processor further comprises a base processing unit controlled by microprograms, said microprograms including self-testing microprograms for said self-test procedure.

* * * * *